(12) United States Patent
Oi

(10) Patent No.: US 6,486,471 B1
(45) Date of Patent: Nov. 26, 2002

(54) COMPOSITE CHARGE PARTICLE BEAM APPARATUS

(75) Inventor: Masamichi Oi, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/313,116

(22) Filed: May 17, 1999

(30) Foreign Application Priority Data

May 19, 1999 (JP) .............................. 10-137120

(51) Int. Cl.[7] .................................................. H01J 37/00
(52) U.S. Cl. .................. 250/310; 250/309; 250/396 ML
(58) Field of Search .................... 250/310, 396 ML, 250/305, 309, 492.2, 396 R

(56) References Cited

U.S. PATENT DOCUMENTS

| | | | | |
|---|---|---|---|---|
| 4,562,352 A | * | 12/1985 | Shiokawa | 250/305 |
| 4,891,524 A | * | 1/1990 | Yasuda et al. | 250/398 |
| 4,976,843 A | * | 12/1990 | Ward et al. | 204/298.36 |
| 5,093,572 A | * | 3/1992 | Hosono | 250/310 |
| 5,146,090 A | * | 9/1992 | Plies | 250/310 |
| 5,258,617 A | * | 11/1993 | Kaneyama et al. | 250/311 |
| 5,389,858 A | * | 2/1995 | Langner et al. | 315/370 |
| 5,412,209 A | * | 5/1995 | Otaka et al. | 250/310 |
| 5,903,004 A | * | 5/1999 | Koshihara et al. | 250/310 |
| 5,994,704 A | * | 11/1999 | Nakasuji | 250/396 ML |
| 6,039,000 A | * | 3/2000 | Libby et al. | 118/723 E |

FOREIGN PATENT DOCUMENTS

| | | |
|---|---|---|
| JP | 63264856 | 11/1988 |
| JP | 3263746 | 11/1991 |
| JP | 4-76437 | 3/1992 |
| JP | 9-61385 | 3/1997 |

* cited by examiner

Primary Examiner—Kiet T. Nguyen
(74) Attorney, Agent, or Firm—Adams & Wilks

(57) ABSTRACT

A charged particle beam apparatus has a plurality of charged particle beam generating systems disposed in a chamber and a neutralizing coil for neutralizing a first charged particle beam generating system to control the magnetic field in the path of a charged particle beam generated by a second charged particle beam system. The first charged particle beam generating system comprises one or more electron beam lens barrels, and the second charged particle beam generating system comprises one or more focused ion beam lens barrels. The neutralizing coil controls an excitation current of the objective lens of a first electron beam lens barrel.

21 Claims, 1 Drawing Sheet

COMPOSITE CHARGE PARTICLE BEAM APPARATUS

BACKGROUND OF THE INVENTION

The present invention relates to a composite charged particle beam apparatus for forming at a predetermined region of a sample surface by irradiating a focused ion beam while scanning over a predetermined region of the sample, and/or observing the sample and/or performing an elemental analysis of the sample surface by irradiating the sample with a focused ion beam and detecting secondary particles and/or an x ray generated in response to irradiation of the sample with an electron beam.

A composite charged particle beam has been realized which is capable of observing and analyzing a sample surface while scanning a focused ion beam or electron beam across a predetermined region of the sample in a sample chamber or irradiating it without scanning (switching, simultaneous irradiation, simultaneous non-irradiation are possible).

This is convenient because a position at which forming is being performed by a focused ion beam can be observed at the same time by a scanning electron microscope and analyzed by EDS.

However, because gallium is generally used as a liquid metal ion source for a focused ion beam, if there is a magnetic field in the path of the focused ion beam, gallium isotopes or clusters are mass-separated, resulting in deterioration in focused ion beam resolving power.

However, when a focused ion beam is to be used, if an excitation current of an objective lens of an electron beam lens barrel is rendered 0, the residual magnetism does not necessarily become 0. Accordingly, in a focused ion beam lens barrel in which a resolving power of approximately several nm is obtainable, even slight residual magnetism is problematic.

There is a residual magnetism countermeasure which provides a magnetic shield at a tip portion of a focused ion beam lens barrel to prevent it from being affected by leakage of a magnetic field from an objective lens of an electron beam lens barrel.

Meanwhile, among known electron beam lens barrels there is an objective lens of an in-lens or semi-in-lens type which is capable of obtaining a high resolving power that is large in magnetic field within a sample chamber. However, the above-mentioned magnetic shield cannot make the objective lens magnetic field asymmetrical. Accordingly, it has been impossible to adopt such an objective lens in a composite apparatus.

Another problem is that if the excitation current of the electron beam lens barrel is rendered 0 each time the focused ion beam lens barrel is used, there is a disadvantage in reproducibility in electron beam focusing when the electron beam lens barrel is to be used again.

An object of the present invention is to prevent resolving power deterioration by focused ion beam mass separation due to magnetic field leakage onto a focused ion beam path from ground magnetism, from an EDS detector or from an electron beam lens barrel and/or to improve the reproducibility of electron beam focusing by reducing the effect of objective lens hysteresis of the electron beam lens barrel.

SUMMARY OF THE INVENTION

In order to solve the above-stated problem, the present invention provides, in a composite charged particle beam apparatus having in a sample chamber one or more first charged particle beam generating systems such as focused ion beam lens barrels and one or more second charged particle beam generating systems such as electron beam lens barrels, an electromagnetic technique for neutralizing the residual magnetism of an objective lens of a charged particle beam generating system, particularly an electron beam lens barrel, and a function of storing a state of one of the charged particle beam generating systems, particularly an electron beam lens barrel, the stored state comprising, for example, an excitation current value of the objective lens of the electron beam lens barrel.

The objective lens residual magnetism of an electron beam lens barrel is neutralized when switching from the electron beam to a focused ion beam, whereby resolving power deterioration due to focused ion beam mass separation is prevented. When switching back to the electron beam, a memorized excitation current is supplied to the objective lens so that the residual magnetism is neutralized and electron beam focusing reproducibility can be improved.

DETAILED DESCRIPTION OF THE INVENTION

Figure 1:
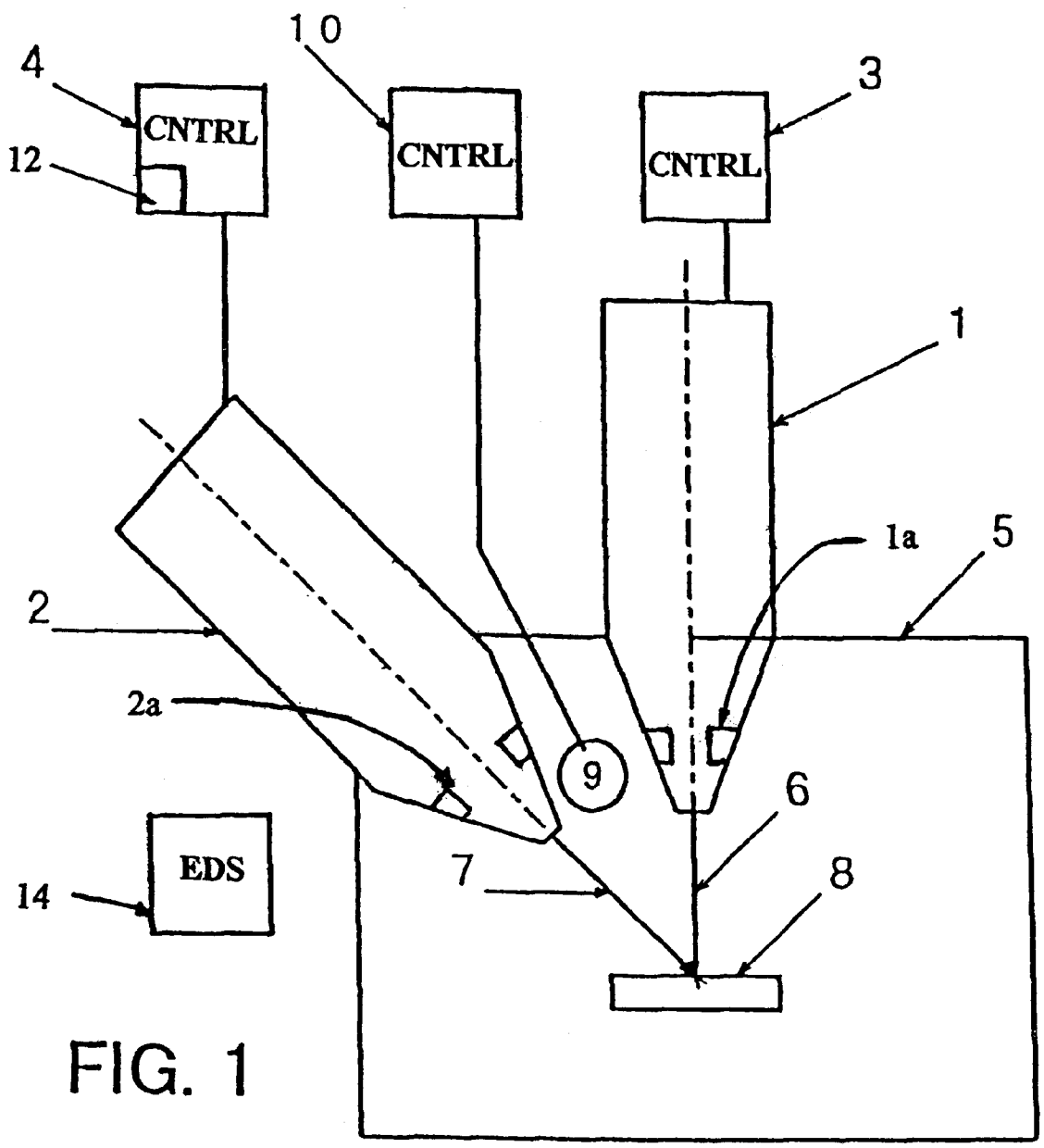
FIG. 1 shows a block diagram of one embodiment of the present invention.

The invention is explained below based on an embodiment illustrated.

FIG. 1 shows an embodiment of the present invention. A focused ion beam lens barrel 1 having a lens 1a controlled by a focused ion beam control system (CNTRL) 3 and an electron beam lens barrel 2 controlled by an electron beam lens barrel control system 4 (CNTRL) (an objective lens 2a of the electron beam lens barrel 2 can adopt an in-lens or semi-in-lens scheme) are arranged within the same sample chamber 5 to enable irradiation of the same region of a sample 8. Further, a neutralizing coil 9 controlled by a controller (CNTRL) 10 is arranged close to an objective lens of the electron beam lens barrel 2 so as not to obstruct an electron beam 7 and focused ion beam 6 paths.

Where using only a focused ion beam 6, an attenuation alternating current magnetic field flows through a neutralizing coil 9 which is sufficient to neutralize to a level that a residual magnetism does not have an affect on the focused ion beam 6 when an excitation current of an objective lens of an electron beam lens barrel 2 is rendered 0, thereby neutralizing the residual magnetism of the objective lens of the electron beam lens barrel 2.

Alternatively, it is possible to adopt a technique to neutralize an excitation current by using an objective lens by itself by use of an attenuation alternating current circuit 12 of the elecron beam lens barrel control system 4 as the neutralizing means 9 instead of the neutralizing coil 9. The attenuation alternating current circuit is one that gradually reduces an alternating current magnetic field in magnetic amplitude. The attenuation alternating current circuit may be comprised of an existing electric circuit of the electron beam lens barrel control system 4, such as a dynamic focus circuit used for focusing on a surface of an inclined sample, or a wobbling circuit used for axial alignment of the objective lens or the like. Such circuits contained in conventional electron beam devices and may be diverted for use as an attenuation alternating current circuit 12 for neutralizing residual magnetism of the objective lens of the electron beam lens barrel.

As described above, according to the present invention, in a composite charged particle beam apparatus having in the same sample chamber one or more focused ion beam lens barrels and one or more electron beam lens barrels, neutralization means are provided close to an objective lens of an electron beam lens barrel, the neutralization means having a neutralization coil and a controller 10 having memorizing means for memorizing an excitation current value of the objective lens of the electron beam lens barrel. In addition, an element analysis function may be performed, such as by an EDS device 14.

According to the present invention, it becomes possible to prevent resolving power deterioration due to focused ion beam mass separation and/or improve reproducibility of electron beam focusing by reducing the effect of hysteresis of an objective lens of an electron beam lens barrel.

What is claimed is:

1. A composite charged particle beam apparatus comprising: a sample chamber; one or more focused ion beam lens barrels disposed in the sample chamber; one or more electron beam lens barrels disposed in the sample chamber; and a neutralization coil disposed in the sample chamber close to an objective lens of an electron beam lens barrel for producing a magnetic field effective to neutralize residual magnetism of the objective lens of the electron beam lens barrel when a focused ion beam lens barrel is activated to irradiate a sample with a focused ion beam and the electron beam lens barrel is deactivated.

2. A composite charged particle beam apparatus according to claim 1; wherein the one or more electron beam lens barrels has at least one of a dynamic focus circuit for focusing on a surface of a sample and a wobbling circuit used for axial alignment of the objective lens, and one of the dynamic focus circuit and the wobbling circuit is used as an attenuation alternating current circuit for neutralizing residual magnetism of the objective lens of the electron beam lens barrel.

3. A composite charged particle beam apparatus according to claim 1; wherein at least one electron beam lens barrel has an objective lens which generates magnetism within the sample chamber.

4. A composite charged particle beam apparatus according claim 1; further comprising means for performing an element analysis function.

5. A composite charged particle beam apparatus according to claim 4; wherein the means for performing element analysis is an Energy Dispersive X-ray Spectrometer.

6. A composite charged particle beam apparatus according to claim 1; further comprising means for storing an excitation current value of the objective lens of the electron beam lens barrel when the objective lens is deactivated; and means for restoring the objective lens to the stored excitation current value when the objective lens is again activated.

7. A composite charged particle beam apparatus comprising: a sample chamber; one or more focused ion beam lens barrels disposed in the sample chamber; one or more electron beam lens barrels disposed in the sample chamber; and an attenuation alternating current circuit for producing a magnetic field effective to neutralize residual magnetism of an objective lens of an electron beam lens barrel when a focused ion beam lens barrel is activated to irradiate a sample with a focused ion beam and the electron beam lens barrel is deactivated.

8. A composite charged particle beam apparatus according to claim 7; wherein the one or more electron beam lens barrels has at least one of a dynamic focus circuit for focusing an electron beam on a surface of a sample and a wobbling circuit used for axial alignment of the objective lens, and one of the dynamic focus circuit and the wobbling circuit is used as an attenuation alternating current circuit for neutralizing residual magnetism of the objective lens of the electron beam lens barrel.

9. A composite charged particle beam apparatus according to claim 7; wherein at least one electron beam lens barrel has an objective lens which generates magnetism within the sample chamber.

10. A composite charged particle beam apparatus according to claim 7; further comprising means for performing an element analysis function.

11. A composite charged particle beam apparatus as recited in claim 10; wherein the means for performing element analysis is an Energy Dispersive X-ray Spectrometer.

12. A composite charged particle beam apparatus according to claim 7; further comprising means for storing an excitation current value of the objective lens of the electron beam lens barrel when the objective lens is deactivated; and means for restoring the objective lens to the stored excitation current value when the objective lens is again activated.

13. A charged particle beam apparatus comprising: a chamber; a plurality of charged particle beam generating systems disposed in the chamber; and neutralizing means for producing a magnetic field effective to neutralize a magnetic field produced by a first charged particle beam generating system upon deactivation of the first charged particle beam generating system and activation of a second charged particle beam generating system to control the magnetic field in the path of a charged particle beam generated by the second charged particle beam generating system.

14. A charged particle beam apparatus according to claim 13; wherein the first charged particle beam generating system comprises one or more electron beam lens barrels, and the second charged particle beam generating system comprises one or more focused ion beam lens barrels.

15. A charged particle beam apparatus according to claim 14; wherein the neutralizing means comprises means for controlling an excitation current of the objective lens of a first electron beam lens barrel.

16. A charged particle beam apparatus according to claim 14; wherein the means for neutralizing the first charged particle beam system comprises a neutralization coil disposed in the chamber close to an objective lens of a first electron beam lens barrel for neutralizing a magnetic field produced by the objective lens of the first electron beam lens barrel; and further comprising means for storing an excitation current value of the objective lens of the first electron beam lens barrel.

17. A charged particle beam apparatus according to claim 14; wherein the means for neutralizing the first charged particle beam system comprises an attenuation alternating current circuit for neutralizing residual magnetism of an objective lens of a first electron beam lens barrel; and further comprising means for storing an excitation current value of the objective lens of the first electron beam lens barrel.

18. A charged particle beam apparatus according to claim 13; wherein the means for neutralizing the first charged particle beam system comprises a neutralization coil disposed in the chamber close to an objective lens of the first charged particle beam generating system for neutralizing a magnetic field produced thereby; and further comprising means for storing an excitation current value of the first charged particle beam generating system.

19. A charged particle beam apparatus according to claim 13; wherein one or more of the charged particle beam generating systems has at least one of a dynamic focus circuit for focusing a charged particle beam on a surface of a sample and a wobbling circuit used for axial alignment of an objective lens, and one of the dynamic focus circuit and the wobbling circuit is used as an attenuation alternating current circuit for neutralizing residual magnetism of the objective lens of one of the charged particle beam generating systems.

20. A charged particle beam apparatus according to claim 13; wherein one or more of the charged particle beam generating systems has at least one of a dynamic focus circuit for focusing a charged particle beam on a surface of a sample and a wobbling circuit for used for axial alignment of an objective lens, and one of the dynamic focus circuit and the wobbling circuit is used as the neutralizing means by being driven as an attenuation alternating current circuit for neutralizing residual magnetism of the objective lens of one of the charged particle beam generating systems.

21. A charged particle beam apparatus according to claim 13; further comprising means for storing a state of the first charged particle beam generating system upon activation of the second charged particle beam generating system.

* * * * *